(12) United States Patent
Akutsu

(10) Patent No.: US 11,028,497 B2
(45) Date of Patent: Jun. 8, 2021

(54) SINGLE CRYSTAL PRODUCTION APPARATUS AND SINGLE CRYSTAL PRODUCTION METHOD

(71) Applicant: Shin Akutsu, Kodaira (JP)

(72) Inventor: Shin Akutsu, Kodaira (JP)

(*) Notice: Subject to any disclaimer, the term of this patent is extended or adjusted under 35 U.S.C. 154(b) by 225 days.

(21) Appl. No.: 16/323,759

(22) PCT Filed: Aug. 8, 2017

(86) PCT No.: PCT/JP2017/028715
§ 371 (c)(1),
(2) Date: Feb. 6, 2019

(87) PCT Pub. No.: WO2018/030383
PCT Pub. Date: Feb. 15, 2018

(65) Prior Publication Data
US 2019/0177874 A1    Jun. 13, 2019

(30) Foreign Application Priority Data

Aug. 8, 2016 (JP) .............................. JP2016-155658

(51) Int. Cl.
*C30B 13/24* (2006.01)
*C30B 13/30* (2006.01)

(52) U.S. Cl.
CPC .............. *C30B 13/24* (2013.01); *C30B 13/30* (2013.01)

(58) Field of Classification Search
CPC ................................ C30B 13/24; C30B 13/30
See application file for complete search history.

(56) References Cited

FOREIGN PATENT DOCUMENTS

| JP | 2013-159524 A | | 8/2013 |
|---|---|---|---|
| JP | 2013-224237 A | | 10/2013 |
| JP | 2013224237 A | * | 10/2013 |
| JP | 2015-081217 A | | 4/2015 |
| JP | 2015-081218 A | | 4/2015 |
| JP | 2015081217 A | * | 4/2015 |
| JP | 2015081218 A | * | 4/2015 |

OTHER PUBLICATIONS

International Search Report (ISR) (PCT Form PCT/ISA/210), in PCT/JP2017/028715, dated Oct. 24, 2017.

* cited by examiner

*Primary Examiner* — Hua Qi
(74) *Attorney, Agent, or Firm* — McGinn P.P. Law Group, PLLC.

(57) ABSTRACT

A single crystal production apparatus that is designed to produce a single crystal by cooling a melting zone formed by a heating part including an infrared generation part and a reflection part, wherein: the reflection part includes a spheroidal mirror and a concave spherical mirror; the infrared generation part is disposed at one focal point of the spheroidal mirror; an opening is formed in the spheroidal mirror on the side of the other focal point of the spheroidal mirror; and the one focal point and the spherical center of the concave spherical mirror fall on the same location.

11 Claims, 5 Drawing Sheets

SINGLE CRYSTAL PRODUCTION APPARATUS AND SINGLE CRYSTAL PRODUCTION METHOD

TECHNICAL FIELD

The present invention relates to a single crystal production apparatus and a single crystal production method.

DESCRIPTION OF RELATED ART

Conventionally, as a single crystal production method, for example, a melting zone method (floating zone method) employing infrared-based heating that utilizes spheroidal mirrors is known (for example, Patent Document 1).

The following illustrates a constitution disclosed in Patent Document 1. First, a raw material shaped into a pellet and a seed crystal shaped into a rod are disposed in locations corresponding to an upward direction and a downward direction, respectively, in the vertical direction (these locations are also referred to as "upper side" and "lower side" below), and then the raw material and the seed crystal are brought close to neighbor each other. Relevant parts are disposed such that one focal point of the spheroidal mirror coincides with the site where the raw material and the seed crystal neighbor each other. The raw material on an upper side is then melted through direct radiation of infrared rays and by means of reflected light from the spheroidal mirror to form a melting zone. In this melting zone, crystal grows (a solid forms or a single crystal forms) from a lower side in contact with the seed crystal, and by lowering both the raw material and the seed crystal, a crystal can be grown continuously from the melting zone.

At this time, relevant parts are disposed in such a manner that infrared rays can be radiated obliquely from above to the site where the raw material and the seed crystal neighbor each other. Also, a shielding tube that surrounds the raw material in the horizontal direction is disposed as a part to adjust cooling conditions for the melting zone.

With the above constitutions, infrared rays radiated obliquely from above are blocked, resulting in the formation of a shadowed region inside the melting zone Ml (the part hatched with oblique lines in FIG. 2 of Patent Document 1). By virtue of the shadowed region, the melting zone Ml can be cooled mildly yet quickly from inside. This enables stable control of the melting zone during growth of crystals ranging from small-diameter to large-diameter ones, and also enables production of high-quality, long single crystals with a large diameter, suitable for industrial use (paragraphs [0023], [0025], etc. of Patent Document 1).

PRIOR ART DOCUMENT

Patent Document

[Patent Document 1] Japanese Patent Application Laid-Open No. 2015-081218

SUMMARY OF THE INVENTION

Problem to be Solved by the Invention

The inventor of the present invention has thoroughly studied Patent Document 1 and has found the following room for improvement.

In the constitution of the single crystal production apparatus illustrated in FIG. 2(a) of Patent Document 1, the use of a shielding tube naturally blocks infrared rays to some extent. Thus, it is undeniable that, compared to a case where no shielding tube is used, there would be a greater energy loss in infrared rays irradiating the site where the raw material and the seed crystal neighbor each other. Moreover, although this is true not only with Patent Document 1, the spheroidal mirror intrinsically has an opening, so infrared rays that are not directed to the focal point (converging point) of the spheroidal mirror and that stream outward from the opening result directly in energy loss. As such, it is desirable to provide some kind of solution to suppress such energy losses.

A problem addressed by the present invention is to propose technology for suppressing energy loss.

Means for Solving the Problem

The inventor of the present invention has conducted intensive research in order to solve the problem stated above. As an outcome, the inventor of the present invention found that the constitution of the present invention stated below, i.e. providing the spheroidal mirror with a concave spherical mirror, can provide a solution for "suppressing energy loss" even when the shielding tube disclosed in Patent Document 1 is to be adopted.

Aspects of the present invention arrived at on the basis of the above finding are set forth in the following.

A first aspect of the present invention is
  a single crystal production apparatus that produces a single crystal by cooling a melting zone formed by heating a raw material through reflection of an infrared ray by a reflection part toward the raw material, the infrared ray being generated by an infrared generation part, wherein
  the reflection part comprises a spheroidal mirror and a concave spherical mirror, and
  the infrared generation part is disposed at one focal point F1 of the spheroidal mirror, an opening is formed in the spheroidal mirror on a side of the other focal point F0 of the spheroidal mirror, and the one focal point F1 and a spherical center of the concave spherical mirror fall on the same location.

A second aspect of the present invention incorporates the invention as set forth in the first aspect, wherein
  the other focal point F0 of the spheroidal mirror is located further on a lower side in the vertical direction as viewed from the focal point F1 at which the infrared generation part is disposed.

A third aspect of the present invention incorporates the invention as set forth in the first or second aspect, wherein
  the apparatus comprises a plurality of sets each constituted by the infrared generation part and the reflection part, and
  the other focal point serves as a common focal point coinciding with the other focal point of the spheroidal mirror in each reflection part.

A fourth aspect of the present invention incorporates the invention as set forth in any one of the first to third aspects, comprising
  a raw material grip portion and a seed crystal grip portion disposed on an upper side and a lower side, respectively, in the vertical direction.

A fifth aspect of the present invention incorporates the invention as set forth in the fourth aspect, wherein
  the concave spherical mirror is disposed so as to oppose a lower side of the opening of the spheroidal mirror in the vertical direction.

A sixth aspect of the present invention incorporates the invention as set forth in any one of the first to third aspects, comprising
  a raw material grip portion and a seed crystal grip portion disposed on a lower side and an upper side, respectively, in the vertical direction.

A seventh aspect of the present invention incorporates the invention as set forth in any one of the first to sixth aspects, wherein
  at least one from among the location of the concave spherical mirror relative to the opening of the spheroidal mirror and a range through which the concave spherical mirror covers the opening is variable.

An eighth aspect of the present invention incorporates the invention as set forth in the seventh aspect, wherein
  the concave spherical mirror includes a constitution enabling displacement of the spherical center of the concave spherical mirror from the location at which the spherical center coincides with the one focal point F1 when reflecting an infrared ray to an inside of the spheroidal mirror.

A ninth aspect of the present invention is
a single crystal production method designed to produce a single crystal by cooling a melting zone formed by a heating part comprising an infrared generation part and a reflection part, the reflection part comprising a spheroidal mirror and a concave spherical mirror,
the method comprising
disposing the infrared generation part at one focal point F1 of the spheroidal mirror, and
forming an opening in the spheroidal mirror on a side of the other focal point F0 of the spheroidal mirror, the one focal point F1 and a spherical center of the concave spherical mirror falling on the same location.

Other aspects include the following.

The concave spherical mirror is made movable.

A hole is formed in the concave spherical mirror (preferably in the center thereof) so that the mirror does not obstruct a straight line connecting the two focal points.

A single crystal production apparatus comprising (or production method employing) a heating part comprising a light source and a reflection part, wherein
  the reflection part comprises a spheroidal mirror and a concave spherical mirror, and
  the light source is disposed at one focal point F1 of the spheroidal mirror, an opening is formed in the spheroidal mirror on a side of the other focal point F0 of the spheroidal mirror, and the one focal point F1 and a spherical center of the concave spherical mirror fall on the same location.

A heat treatment apparatus comprising (or heat treatment method employing) a heating part comprising a light source and a reflection part, wherein
  the reflection part comprises a spheroidal mirror and a concave spherical mirror, and
  the light source is disposed at one focal point F1 of the spheroidal mirror, an opening is formed in the spheroidal mirror on a side of the other focal point F0 of the spheroidal mirror, and the one focal point F1 and a spherical center of the concave spherical mirror fall on the same location.

A reflection part (reflection mirror) comprising a concave spherical mirror and a spheroidal mirror constituted by a concave mirror, wherein
  among the two focal points of the spheroidal mirror, the focal point closer to the bottom of the concave of the spheroidal mirror and the spherical center of the concave spherical mirror fall on the same location.

A single crystal production apparatus that produces (or production method designed to produce) a single crystal by cooling a melting zone formed by a heating part comprising an infrared generation part and a reflection part, wherein
  the reflection part comprises
  a spheroidal mirror and
  a confrontation mirror disposed so as to oppose the spheroidal mirror, and
  the confrontation mirror is disposed so as to cover at least part of an opening of the spheroidal mirror between the two focal points of the spheroidal mirror without obstructing a straight line connecting the two focal points.

A single crystal production apparatus that produces (or production method designed to produce) a single crystal by cooling a melting zone formed by heating a raw material through reflection of an infrared ray by a reflection part toward the raw material, the infrared ray being generated by an infrared generation part, wherein
  the reflection part comprises a spheroidal mirror and an infrared shielding member, and
  the infrared shielding member is disposed so as to cover at least part of an opening of the spheroidal mirror between the two focal points of the spheroidal mirror without obstructing a straight line connecting the two focal points.

Effect of the Invention

The present invention enables suppression of energy loss.

BRIEF DESCRIPTION OF THE DRAWINGS

FIG. 2A is a plan view and FIG. 2B is a sectional view cut along A-A'.

FIG. 5A is a plan view and FIG. 5B is a sectional view cut along A-A',

DETAILED DESCRIPTION OF THE INVENTION

Embodiments of the present invention will be described below in the following order.
1. Single Crystal Production Apparatus
  1-A) Outline of Single Crystal Production Apparatus
  1-B) Raw Material Grip Portion
  1-C) Seed Crystal Grip Portion
  1-D) Heating Part
  1-E) Shielding Tube
2. Single Crystal Production Method
  2-A) Preparation Step
  2-B) Heating Step
  2-C) Single Crystal Growing Step
3. Effects of Embodiments 4. Modification etc.

It should be noted that for details that are not described below, known constitutions in the art related to single crystal production apparatuses and methods based on the melting zone method (e.g., constitutions disclosed in Japanese Patent Applications Laid-Open Nos. 2015-081217 and 2015-081218 (Patent Document 1) and Japanese Patent No. 5926432 by the applicant of the present application) may be adopted, as appropriate.

This embodiment mainly illustrates an example in which a constitution disclosed in Japanese Patent Application Laid-Open No. 2015-081218 (for example, disposing a seed crystal on a lower side and a raw material on an upper side) is adopted. Thus, the details disclosed in Japanese Patent Application Laid-Open No. 2015-081218 shall be regarded as being adopted for details that are not described below.

An example adopting a constitution disclosed in Japanese Patent Application Laid-Open No. 2015-081217 (for example, disposing a seed crystal on an upper side and a raw material on a lower side) will be illustrated in the section <4. Modification etc.>.

In this specification, "-" indicates a range between two prescribed values that is inclusive of those values.

<1. Single Crystal Production Apparatus>

1-A) Outline of Single Crystal Production Apparatus

Figure 1:
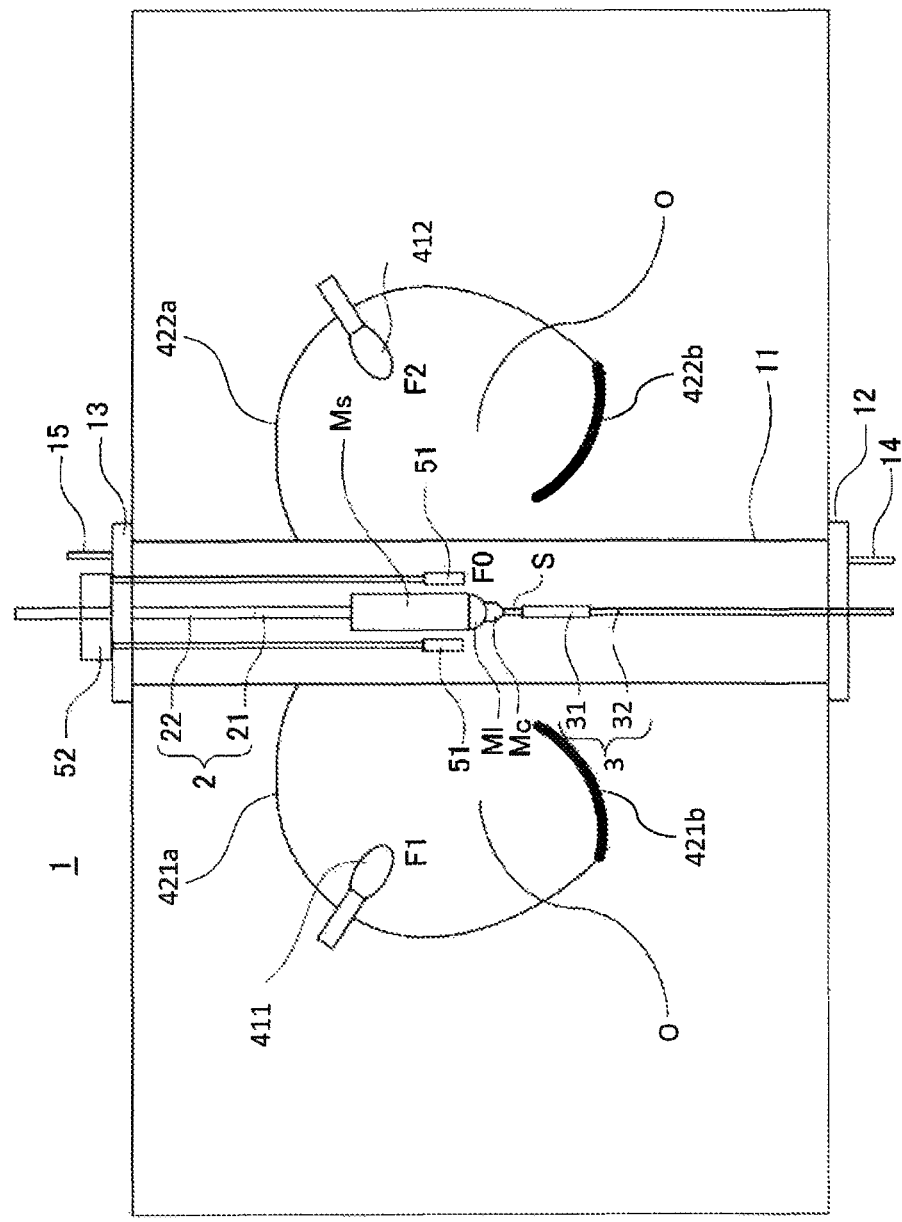
FIG. 1 is a schematic sectional view of a single crystal production apparatus according to an embodiment.

A basic constitution of a single crystal production apparatus 1 according to this embodiment will be described with reference to FIG. 1. FIG. 1 is a schematic sectional view of the single crystal production apparatus 1 according to this embodiment.

The single crystal production apparatus 1 according to this embodiment mainly includes the following constitutions. It should be mentioned in advance that the main feature of this embodiment lies in the heating part 4 described below.

Raw material grip portion 2: disposed in an upper side in the vertical direction; movable in the vertical direction; and rotatable around a central axis extending in the vertical direction.

Seed crystal grip portion 3: disposed in a lower side in the vertical direction; movable in the vertical direction; and rotatable around a central axis extending in the vertical direction.

Heating part 4: heats a raw material M gripped by the raw material grip portion 2 by radiating infrared rays onto the raw material M in order to melt the raw material M.

Shielding tube 51 serving to block infrared rays: capable of surrounding, in the horizontal direction, at least part of the raw material M gripped by the raw material grip portion 2; and movable in the vertical direction.

A crystal growth furnace for growing a single crystal is sealed with a quartz furnace tube 11 which, together with a lower shaft flange 12 and an upper shaft flange 13, insolates a growth atmosphere inside the furnace from the outside. An atmosphere having an appropriate composition is introduced into the furnace through an atmosphere introduction port 14 and is discharged through an atmosphere discharge port 15, so that atmospheric components and pressure inside the furnace can be kept appropriate.

In this embodiment, what constitutes a significant difference to Japanese Patent Application Laid-Open No. 2015-081218 is the "heating part 4", more specifically, that a concave spherical mirror is provided for the spheroidal mirror as a separate member. All other constitutions are equivalent to the details disclosed in Japanese Patent Application Laid-Open No. 2015-081218, so description thereof will be omitted as appropriate.

In the following, the aforementioned constitutions will be mainly described. Hereinbelow, to facilitate understanding of the invention, description will be given of specific embodiments of the respective parts and portions of the single crystal production apparatus 1. Needless to say, however, the present invention is not limited to a constitution in which these parts and portions are made into specific embodiments.

1-B) Raw Material Grip Portion

The raw material grip portion 2 according to this embodiment is disposed on an upper side while opposing the seed crystal grip portion 3 and is constituted so as to be capable of gripping the raw material M in a solid form. The raw material M used in this embodiment has a pellet form. Accordingly, the raw material grip portion 2 is formed such as to be engageable with the raw material M in the pellet form. More specifically, the raw material grip portion 2 according to this embodiment is constituted by a "raw material holder 21" that grips the raw material M and an "upper shaft 22" that serves as a rotation axis and a vertical movement axis for the raw material holder 21.

The raw material grip portion 2 is constituted so as to be movable in the vertical direction and rotatable around the central axis extending in the vertical direction. In this embodiment, the upper shaft 22 serves as the central axis. A drive source that drives the raw material grip portion 2 is not illustrated in the drawings.

1-C) Seed Crystal Grip Portion

The seed crystal grip portion 3 according to this embodiment is disposed on a lower side while opposing the raw material grip portion 2 and is constituted so as to be capable of gripping the seed crystal S, and includes, for example, a seed crystal holder 31 and a lower shaft 32. A constitution known in the art may be adopted for the seed crystal grip portion 3.

The seed crystal grip portion 3 is also constituted so as to be movable in the vertical direction and rotatable around the central axis extending in the vertical direction. A drive source that drives the seed crystal grip portion 3 is not illustrated in the drawings.

1-D) Heating Part 4

The heating part 4 according to this embodiment constitutes an important feature. The heating part 4 according to this embodiment includes four infrared generation parts disposed in four directions at roughly 90° angles (hereinbelow, reference symbol 41 may be assigned collectively to these parts) and has the function of heating and melting the raw material M gripped by the raw material grip portion 2. The infrared generation parts are disposed such that, in a plan view of the single crystal production apparatus 1, the infrared generation parts 411 and 412 oppose each other and the other infrared generation parts oppose each other.

In addition to the infrared generation parts 41, the heating part 4 according to this embodiment also includes reflection parts (hereinbelow, reference symbol 42 may be assigned collectively to these parts) that serve to enhance irradiation efficiency by reflecting infrared rays toward the raw material M.

The reflection parts 42 each include spheroidal mirrors (hereinbelow, reference symbol 421a may represent these mirrors or the reference symbols may be omitted), inner surfaces of which are mirror surfaces, and concave spherical mirrors (hereinbelow, reference symbol 421b may represent these mirrors or the reference symbols may be omitted, and the concave spherical mirrors may be simply referred to as "spherical mirrors") that are disposed so as to oppose openings O of the spheroidal mirrors 421a.

The spheroidal mirror 421*a* is a concave mirror and one known in the art may be used therefor. As illustrated in FIG. 1, etc., the infrared generation part 41 is disposed at one focal point F1 of the spheroidal mirror 421*a* and an opening is formed in the mirror on the side of the other focal point F0 thereof. Here, one of the two focal points of the spheroidal mirror 421*a* that is closer to the bottom of the concave surface of the spheroidal mirror 421*a* is denoted by "F1" and the one that is farther therefrom (corresponding to the site where the melting zone Ml is located) is denoted by "F0", and the infrared generation part 41 is provided at the focal point F1.

In FIG. 1, only the infrared generation parts 411, 412 are illustrated among the infrared generation parts 41 and only the reflection parts 421, 422 are illustrated among the reflection parts 42. As illustrated in FIG. 1, the spheroidal mirrors 421*a*, 422*a* of the reflection parts 42 have a common focal point F0. Additionally, as the other focal point, the spheroidal mirror 421*a* has the focal point F1 further on an upper side than the focal point F0 and the spheroidal mirror 422*a* has the focal point F2 further on an upper side than the focal point F0.

Figure 2A:
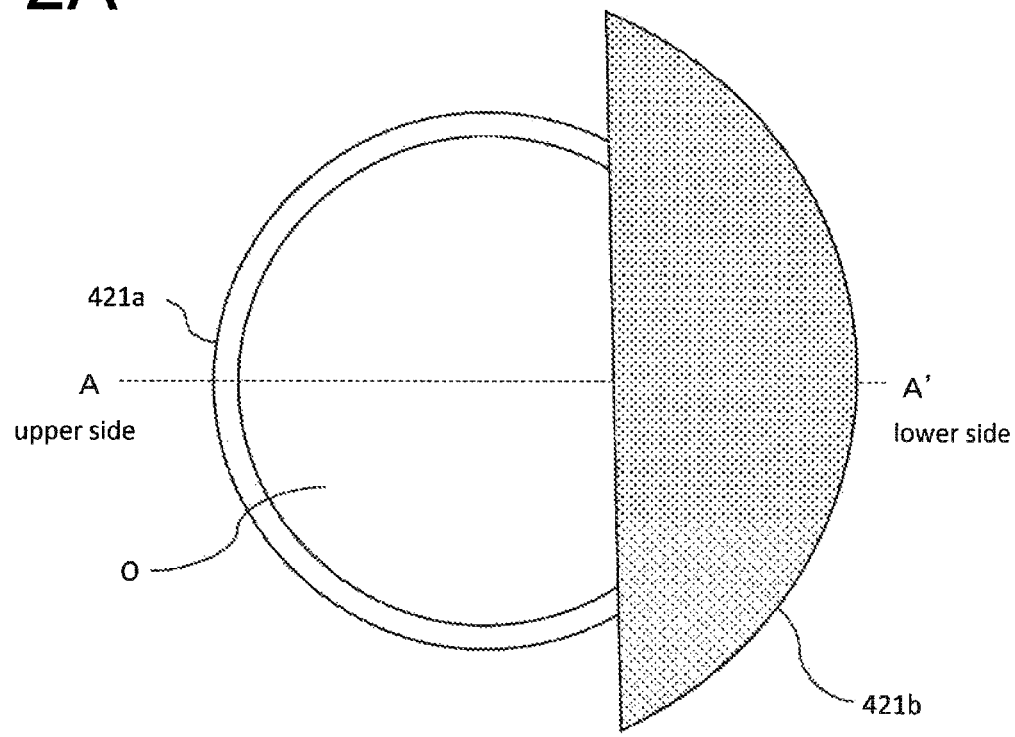
FIGS. 2A and 2B are a set of schematic views of a reflection part according to an embodiment, where
Figure 2B:
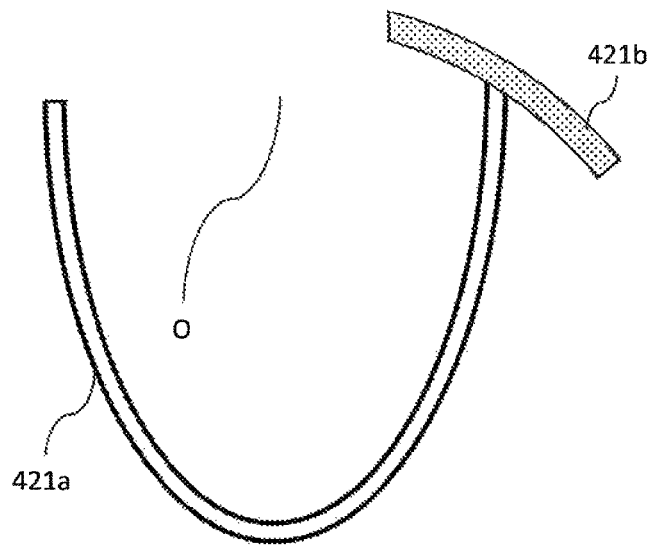

The spherical mirror 421*b* will now be described with reference to FIG. 1 and FIG. 2. FIG. 2 is a set of schematic views of the reflection part 421 according to this embodiment, where (a) is a plan view and (b) is a sectional view cut along A-A'.

In this embodiment, as illustrated in FIG. 1, for the spherical mirror 421*b* of the reflection part 42, the spherical center of the spherical mirror 421*b* and one focal point F1 of the spheroidal mirror 421*a* fall on the same location. Likewise, for the spherical mirror 422*b*, the spherical center of the spherical mirror 422*b* and the focal point F2 of the spheroidal mirror 422*a* fall on the same location. While the "same location" as referred to herein naturally encompasses cases where there is an exact match between the two locations, a deviation of about 2-3 mm would not cause a substantive problem.

As illustrated in FIGS. 2(*a*) and (*b*), the spherical mirror according to this embodiment is a concave mirror having a mirror surface with a shape obtained by cutting away a portion of a true sphere. The same stands for the other.

Figure 3:
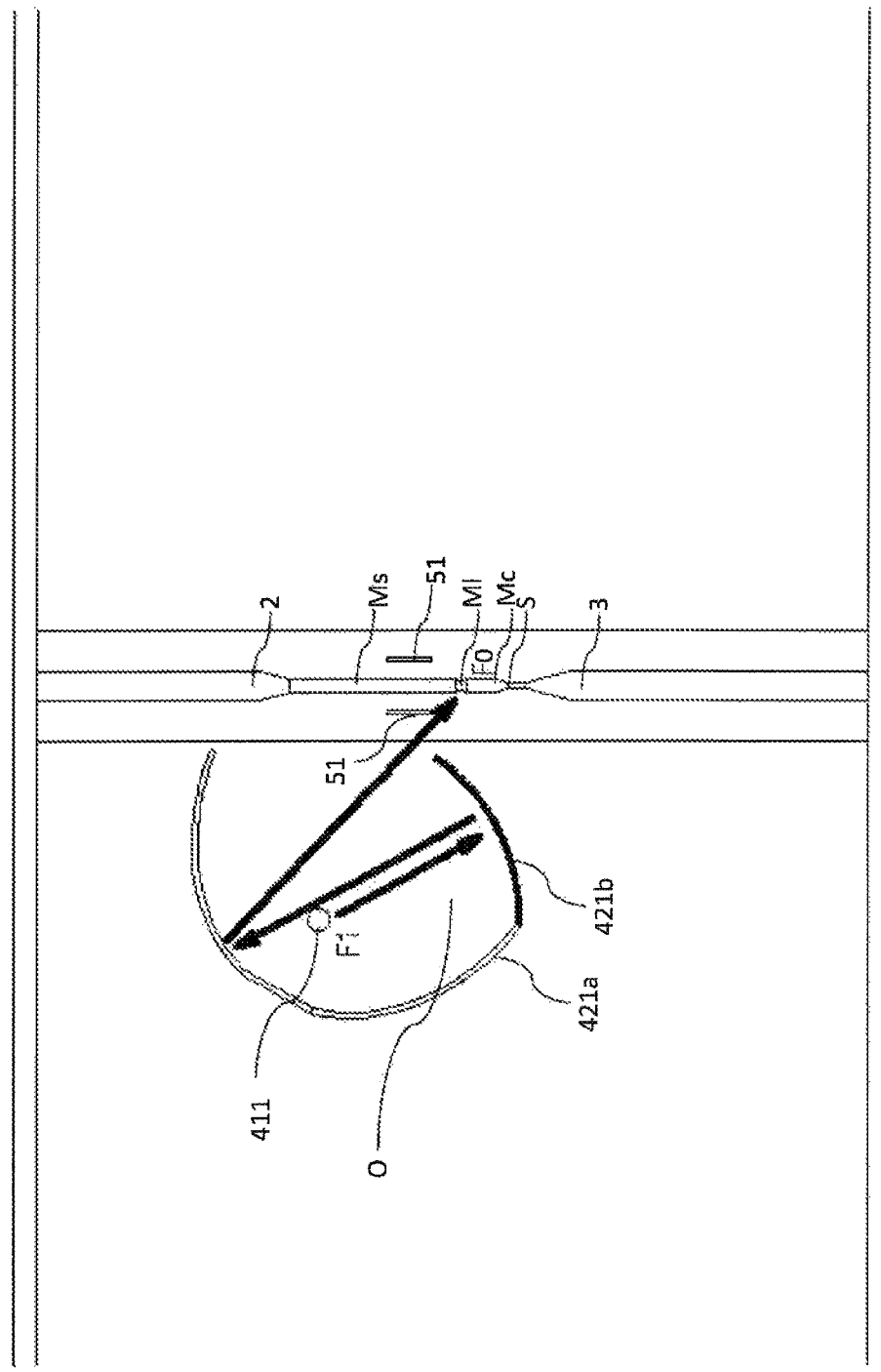
FIG. 3 is a schematic sectional view of a single crystal production apparatus according to an embodiment, focusing on a spheroidal mirror and a concave spherical mirror.

By virtue of the spherical mirror 421*b* being disposed in relation to the spheroidal mirror 421*a* in the aforementioned manner, unlike usual cases where infrared rays reflected by the spheroidal mirror 421*a* stream outward from the opening O and leak without irradiating the site (focal point F0) where the raw material M and the seed crystal S neighbor each other, the reflected infrared rays can be once again returned to the inside of the spheroidal mirror 421*a* (i.e., to a region which is encompassed by the opening O and the spheroidal mirror 421*a* and in which the focal point F1 is located) by the spherical mirror 421*b*, as indicated by the black arrows in FIG. 3. Moreover, one focal point F1 of the spheroidal mirror 421*a* and the spherical center of the spherical mirror 421*b* fall on the same location; consequently, the infrared rays can be reflected efficiently toward the other focal point F0. That is to say, energy loss can be suppressed.

Further, the spherical mirror 421*b* not only serves to reflect infrared rays but, in this embodiment, also enables smooth cooling of the seed crystal side of the melting zone Ml. This is because the spherical mirror 421*b* can prevent radiation of infrared rays toward the seed crystal side of the melting zone Ml.

Needless to say, the above description is not only applicable to the positional relation between the spheroidal mirror 421*a* and the spherical mirror 421*b* but also to the positional relations between the spheroidal mirror 422*a* and the spherical mirror 422*b*.

As illustrated in FIG. 1, the infrared generation parts 411, 412 are disposed respectively at the focal points F1, F2. For the constitution of the infrared heat generation part itself, one known in the art may be adopted. For example, a halogen lamp or a xenon arc lamp or a combination thereof may be adopted. A constitution is adopted in which the common focal point F0 of the spheroidal mirrors 421*a*, 422*a* corresponds to a heated region and the melting zone Ml formed due to contact between the melting raw material M and the seed crystal S is disposed in the heated region. Then, the raw material grip portion 2 and the seed crystal grip portion 3 are separated from each other so that the melting zone Ml is displaced from the heated region; in this way, the melting zone Ml is cooled and a single crystal is grown.

Another feature of this embodiment lies in disposing the infrared generation part 41 further on an upper side in the vertical direction than the melting zone Ml. In other words, the infrared generation parts 41 and the reflection parts 42 are constituted such that the infrared generation parts 41 are disposed further on an upper side than the common focal point F0 of the spheroidal mirrors, and the effects below are demonstrated accordingly.

First, the lower end of the raw material M and the seed crystal S are brought into contact with each other, and the melting zone Ml is formed by heating using infrared rays. At this point, the seed crystal S is also melting. Thereafter, the distance between the raw material M and the seed crystal S is increased to displace the melting zone Ml from an infrared converging point (F0), thereby allowing the same to be cooled. Since the raw material grip portion 2 is disposed on an upper side, the raw material grip portion 2 and the seed crystal grip portion 3 are moved relative to each other such that a portion resulting from the growth of a single crystal from the melting zone Ml (hereinafter, referred to as "growth portion Mc"; there are also cases where the single crystal is referred to as "Mc") moves to a lower side.

Now, as illustrated in FIG. 1, if the infrared generation part 41 is disposed further on an upper side than the melting zone Ml, even when the growth portion Mc moves toward an upper side, the infrared generation part 41 will still be higher, so the growth portion Mc continues to be heated to a certain extent. This makes the temperature gradient during single crystal growth gentle. As a result, the melting zone Ml in the raw material M can be kept appropriate, thus making it possible to produce a high-quality single crystal.

Preferably, specific disposition of the infrared generation part 41 includes disposing the infrared generation part 41 further on an upper side by 10-20 degrees relative to the melting zone Ml of the raw material M in the horizontal direction.

Setting the degrees to 10 or more makes it possible to continue heating of the melting zone Ml to a certain degree when the melting zone Ml is moved upward and the single crystal grows, resulting in a gentle temperature gradient. As a result, generation of crystal interface and low angle grain boundary is suppressed, and crystallinity is improved.

Setting the degrees to 20 or less enables appropriate concentration of infrared rays toward the melting zone Ml, making appropriate formation and control of the melting zone Ml possible.

1-E) Shielding Tube

In this embodiment, for an even more preferable constitution, there is provided a shielding tube 51 that is movable in the vertical direction relative to the raw material grip portion 2. Provision of the shielding tube 51 enables radiation of infrared rays exclusively toward a prescribed portion of the raw material M. The specific constitution of the shielding tube 51 is equivalent to that disclosed in Patent Document 1 (Japanese Patent Application Laid-Open No. 2015-081218).

The above describes the single crystal production apparatus 1 according to this embodiment; needless to say, however, constitutions other than the above may be adopted, as appropriate, in accordance with the usage of the single crystal production apparatus 1 in question.

<2. Single Crystal Production Method>

Next, an operation procedure for the single crystal production apparatus 1 according to this embodiment will be described. Part of the details of the steps below overlaps the details described in the section <1. Single Crystal Production Apparatus>. Accordingly, details that are not described below are equivalent to those described in <1. Single Crystal Production Apparatus>. Meanwhile, it is also possible to adopt, as appropriate, known constitutions in the art (e.g., constitutions disclosed in Japanese Patent Application Laid-Open No. 2015-081218 by the applicant of the present application) for details that are not described below.

2-A) Preparation Step

First, as illustrated in FIG. 1, the constitutions needed for the single crystal production apparatus 1 are disposed in the manner described in <1. Single Crystal Production Apparatus>.

2-B) Heating Step

Next, in this step, infrared rays generated by the infrared generation part 41 are radiated to the raw material M directly and through reflection by the reflection part 42 obliquely from above as seen from the site where the raw material M and the seed crystal S neighbor each other. Thus, the lower end of the raw material M in the pellet form, which corresponds to the portion facing the seed crystal S, is melted. With this melted portion, the seed crystal S that has been slightly melted is brought into contact, and the melting zone Ml is formed as a result. Here, since the heating part 4 (in particular, the spheroidal mirrors 421a, 422a and the spherical mirrors 421b, 422b provided for the spheroidal mirrors, all these mirrors constituting the reflection parts 42) are constituted in the manner described above, the seed crystal side of the melting zone can be smoothly cooled while suppression of energy loss is also achieved.

2-C) Single Crystal Growing Step

In this step, a single crystal is grown from the melting zone Ml. By lowering both the raw material M and the seed crystal S and by virtue of the aforementioned spherical mirrors, the growth portion Mc in the melting zone Ml is cooled smoothly and a single crystal with a large diameter can be formed. After formation of a prescribed amount of single crystal, necessary work is carried out, as appropriate, to terminate the single crystal production.

<3. Effects of Embodiments>

The following effects are demonstrated according to this embodiment.

First, by disposing the spherical mirror 421b in the aforementioned manner in relation to the spheroidal mirror 421a, the reflected infrared rays can be once again returned to the spheroidal mirror 421a by the spherical mirror 421b. Moreover, one focal point F1 of the spheroidal mirror 421a and the spherical center of the spherical mirror 421b fall on the same location; consequently, the infrared rays can be reflected efficiently toward the other focal point F0. That is to say, energy loss can be suppressed.

Note: The inventor of the present invention has evidenced that due to this suppression of energy loss, in some cases, even without providing a light guide, or the like, between the spheroidal mirror 421a and the melting zone Ml, it is possible to achieve an irradiation amount equivalent to that achieved with a laser beam.

Furthermore, by virtue of the spherical mirror 421b, excessive irradiation of the seed crystal side of the melting zone Ml with infrared rays can be prevented. As a result, the seed crystal side of the melting zone Ml can be cooled smoothly.

<4. Modification etc.>

The technical scope of the present invention is not limited to the embodiments described above and includes various modifications and improvements made within an extent to which specific effects obtained from constituent features of the invention, as well as the combination of those features, can be derived.

Type of Single Crystal

The technical idea of the present invention is not limited by a type of single crystal. The technical idea of the present invention is applicable to any single crystal that is produced by cooling a melting zone Ml. For example, according to the above, it is applicable to a multi-element type crystal containing a substance having a significantly different melting point or a crystal containing an additive having a small segregation coefficient (for example, Si Ge, Ce: LSO, or the like), and furthermore, it is also applicable to a metal or an alloy composed of crystals.

Type of Heating Part

In the above embodiment, a case is illustrated where an infrared generation part 41 is used as a light source of the heating part 4. In this regard, although the use of other light sources than the infrared generation part 41 is not to be denied, as far as convergence is concerned, it is preferable to use the infrared generation part 41 rather than a light source for laser beams, also from the viewpoint of cost. It should be noted that "light" as referred to in this specification means light in the range between infrared rays and ultraviolet rays (wavelength: 1 nm-1 mm).

The number of spheroidal mirrors and infrared generation parts provided may be different from that illustrated in this embodiment. Moreover, a laser beam generation part may be provided further on a lower side than the spheroidal mirror 421a, in addition to the infrared generation part 41. The laser beam generation part may be used to radiate a laser beam to the raw material M, in addition to the infrared rays. Through intensive radiation of a laser beam to a solid phase having precipitated in the melting zone Ml using a target scope (not illustrated in the drawings), it is possible to heat the raw material M partially to re-dissolve the solid phase in the melting zone Ml. This makes stable single crystal growth possible. For this purpose, the laser beam generation part may be disposed at a certain inclination angle with respect to the melting zone Ml, similarly to the spheroidal mirror 421a. For the laser beam generation part, a construction may be adopted to make up-down, left-right movement and the inclination angle of the laser beam generation part freely controllable. An apparatus equipped with a laser beam generation part is costly, however, so it is preferable to constitute the single crystal production apparatus 1 such that while a laser beam generation part may be provided therein as an option, the basic constitution includes the infrared generation part 41 alone.

Disposition of Seed Crystal and Raw Material

In the above embodiment, the seed crystal S is disposed on a lower side and the raw material M is disposed on an upper side. Meanwhile, it is also possible to dispose the raw material grip portion 2 on a lower side and the seed crystal grip portion 3 on an upper side as in the disclosure of Japanese Patent Application Laid-Open No. 2015-081217. When doing so, the aforementioned spherical mirror may be made to cover the function of the infrared shielding part disclosed in Japanese Patent Application Laid-Open No. 2015-081217. In this case, the spherical mirror is to be disposed further on a lower side than the opening O of the spheroidal mirror, similarly to the above embodiment.

Disposition of Spherical Mirror

Figure 4:
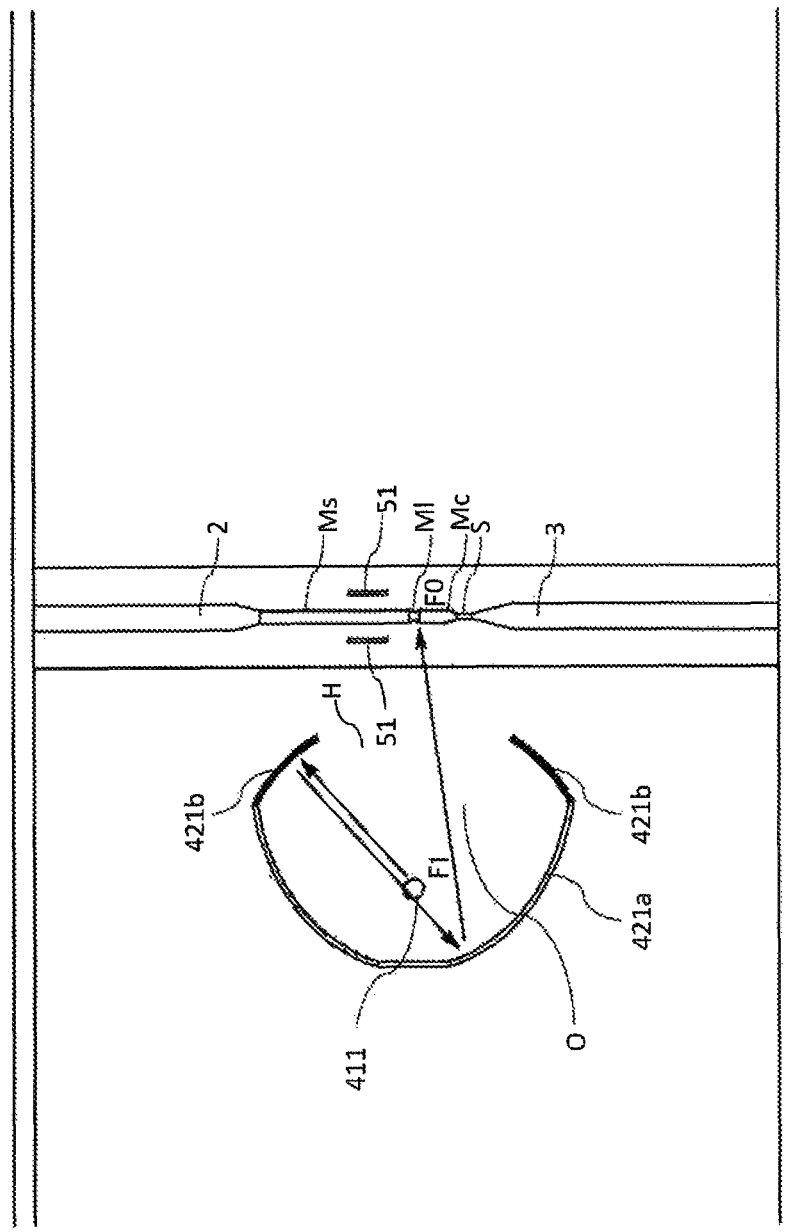
FIG. 4 is a schematic sectional view of a single crystal production apparatus according to a modification, focusing on a spheroidal mirror and a concave spherical mirror.

In the above embodiment, a spherical mirror is disposed only at a location further on a lower side than the opening O of the spheroidal mirror, but an additional spherical mirror may also be disposed further on an upper side of the opening O, as illustrated in FIG. 4, for example. In this case, the spherical mirror on an upper side can have an equivalent function to the shielding tube 51, so there is no need to provide the shielding tube 51.

In the above embodiment, the seed crystal S is disposed on a lower side and the raw material M is disposed on an upper side, so the spherical mirror is disposed further on a lower side than the opening O of the spheroidal mirror. Meanwhile, when the raw material grip portion 2 is disposed on a lower side and the seed crystal grip portion 3 is disposed on an upper side as in the disclosure of Japanese Patent Application Laid-Open No. 2015-081217 mentioned above, the seed crystal S is located on an upper side, in which case the seed crystal side of the melting zone Ml is located on an upper side of the melting zone Ml. If so, disposing the spherical mirror further on an upper side than the opening O of the spheroidal mirror will make it possible to cool this portion smoothly.

Figure 5A:
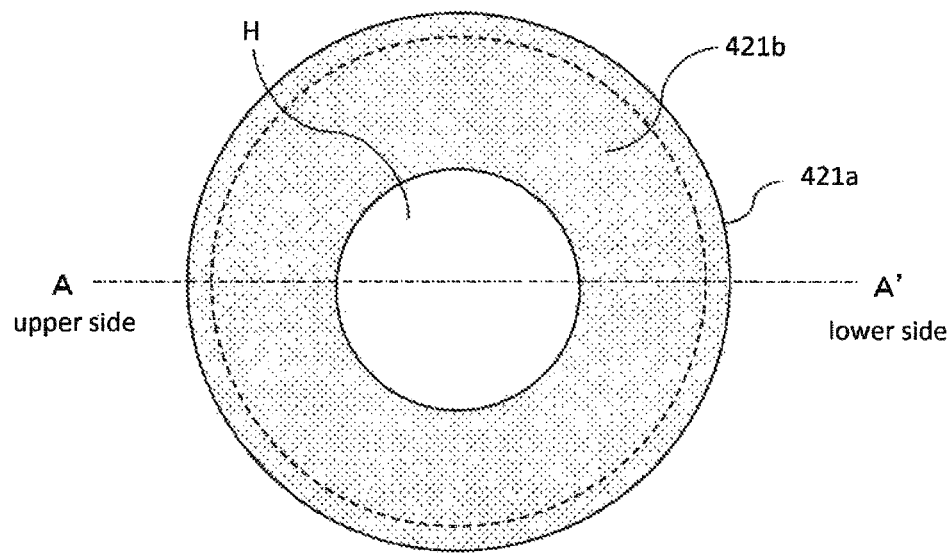
FIGS. 5A and 5B are a set of schematic views of a reflection part according to a modification, where
Figure 5B:
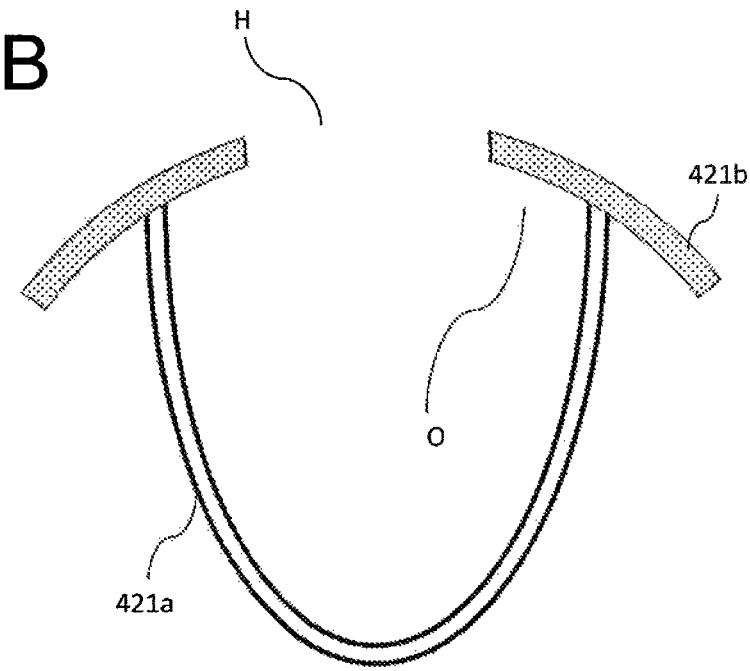

Further, as illustrated in FIG. 5, it is also possible to form a hole H in the spherical mirror 421b (preferably, in the center thereof) and allow the spherical mirror 421b to cover the opening O of the spheroidal mirror 421a while ensuring that the spherical mirror 421b does not obstruct the straight line connecting the two focal points. Needless to say, in this case as well, it is extremely preferable that the focal point F1 of the spheroidal mirror 421a and the spherical center of the spherical mirror 421b fall on the same location.

It is preferable for the diameter of the hole H in the center of the spherical mirror 421b to be 1-1000 mm or, when specifying otherwise, 1%-99% of the diameter of the opening O of the spheroidal mirror 421a, in view of a balance between sufficient irradiation amount of infrared rays irradiating the raw material M, suppression of energy loss, smooth cooling of the seed crystal side of the melting zone, and so on.

The reason for which the spherical mirror 421b is disposed so as not to obstruct the straight line connecting the two focal points is to, while preventing infrared rays from irradiating the seed crystal side of the melting zone, enable efficient reflection of infrared rays toward the other focal point F0, eventually.

In a case where, as illustrated in FIG. 5, a hole is formed in the spherical mirror 421b while the hole size is set to be small (for example, less than or equal to 3 mm, preferably less than or equal to 1 mm) and infrared rays are radiated to the raw material M with reflection of the infrared rays involved, then the irradiation amount becomes maximal so that an irradiation amount equivalent to that achieved with a laser beam can be achieved even when using only a single set of spheroidal mirror 421a and spherical mirror 421b.

Disposition of Infrared Generation Part

The above embodiment illustrates a case where the seed crystal S is disposed on a lower side and the raw material M is disposed on an upper side. Meanwhile, as illustrated in FIG. 4 for example, the infrared generation part 41 may be disposed at a position that is horizontal to the melting zone Ml or further on a lower side than the melting zone Ml. In this case, the irradiation amounts for the seed crystal side and the raw material side of the melting zone Ml may be adjusted with respect to the given disposition of the spherical mirror.

Construction of Spherical Mirror

To facilitate this adjustment, the spherical mirror may be made movable. To illustrate a specific example, the spherical mirror may be constituted in the form of a shutter by connecting spherical mirror members, with the long axes thereof extending in the horizontal direction, in the manner of a rosary and in the direction corresponding to the short axes of the spherical mirror members, and then the shutter may be raised or lowered so that the range through which the spherical mirror covers the opening O of the spheroidal mirror can be varied as appropriate. Moreover, it is preferable to adopt a construction such that the location of the spherical mirror relative to the opening of the spheroidal mirror is variable. If so, appropriate adjustments can be made in accordance with the intention of an operator, such as disposing the spherical mirror further on a lower side than the spheroidal mirror or reversely on an upper side, as illustrated above, or disposing the spherical mirror so as to be in front of, and opposing, the opening of the spheroidal mirror.

That is to say, for this spherical mirror, it is preferable that at least either one of the following is variable: the location of the spherical mirror relative to the opening of the spheroidal mirror; and the range through which the spherical mirror covers the opening.

Furthermore, by making the spherical mirror movable, a mechanism may be adopted in which, for example, the spherical mirror can be accommodated in a location where the spherical mirror does not oppose the opening O prior to the use of the single crystal production apparatus 1, and when the single crystal production apparatus 1 is to be used, the spherical mirror can be moved in sliding fashion to a location where the spherical mirror opposes the opening O. Focusing on this mechanism, the following expression may be used to describe the mechanism.

"A single crystal production apparatus comprising (or production method employing) a constitution wherein the infrared generation part is disposed at one focal point F1 of the spheroidal mirror, an opening is formed in the spheroidal mirror on a side of the other focal point F0 of the spheroidal mirror, and the one focal point F1 and a spherical center of the concave spherical mirror fall on the same location."

Application to Single Crystal Production Method (CVD) without Melting Zone Formation The above embodiment illustrates a method for producing a single crystal through the formation of a melting zone Ml. However, the aforementioned reflection part 42 may also be adopted in light convergence-based heating involved in other methods (for example, chemical vapor deposition (CVD)). When the CVD is adopted, energy loss can be suppressed by adopting the aforementioned reflection part in heating the target through light convergence. In other words, the problem "suppressing energy loss" from among the details mentioned in relation to the problems addressed by the present invention can be solved. There are no particular limitations on a light source to be adopted in this CVD-based method, and the infrared generation part 41, a light source for laser beams, etc., or the combination of those may be used. To describe this example, the following expression may be adopted.

"A single crystal production apparatus comprising (or production method employing) a heating part comprising a light source and a reflection part, wherein
the reflection part comprises a spheroidal mirror and a concave spherical mirror, and
the light source is disposed at one focal point F1 of the spheroidal mirror, an opening is formed in the spheroidal mirror on a side of the other focal point F0 of the spheroidal mirror, and the one focal point F1 and a spherical center of the concave spherical mirror fall on the same location."

Heat Treatment Apparatus or Heat Treatment Method

The above embodiment mainly illustrates a single crystal production apparatus that forms a melting zone Ml by melting a raw material M, but the technical idea of the present invention is applicable also to apparatuses and methods in which a substance is heated to a degree that the substance does not melt. Examples thereof include a heat treatment apparatus for heating (for example, annealing) a sample that is attached to a measurement device. With such a heat treatment apparatus as well, the problem "suppressing energy loss" from among the details mentioned in relation to the problems addressed by the present invention can be solved. To describe this example, the following expression may be adopted.

"A heat treatment apparatus comprising (or heat treatment method employing) a heating part comprising a light source and a reflection part, wherein
the reflection part comprises a spheroidal mirror and a concave spherical mirror, and
the light source is disposed at one focal point F1 of the spheroidal mirror, an opening is formed in the spheroidal mirror on a side of the other focal point F0 of the spheroidal mirror, and the one focal point F1 and a spherical center of the concave spherical mirror fall on the same location."

Reflection Part as Invention

The present invention relates to a single crystal production apparatus and a single crystal production method, but the technical idea of the present invention is incorporated in the aforementioned reflection part 42, which itself can solve the problem addressed by the present invention. Therefore, the aforementioned reflection part 42 itself may stand on its own as an invention. To describe this example, the following expression may be adopted.

"A reflection part (reflection mirror) comprising a concave spherical mirror and a spheroidal mirror constituted by a concave mirror, wherein
an opening is formed in the spheroidal mirror on a side of one focal point F0 of the spheroidal mirror, and the other focal point F1 of the spheroidal mirror and a spherical center of the concave spherical mirror fall on the same location."

Alternatively, the same example may be expressed differently, as follows.

"A reflection part (reflection mirror) comprising a concave spherical mirror and a spheroidal mirror constituted by a concave mirror, wherein among the two focal points of the spheroidal mirror, the focal point closer to the bottom of the concave of the spheroidal mirror and a spherical center of the concave spherical mirror fall on the same location".

Confrontation Mirror other than Spherical Mirror

The above embodiment illustrates a spherical mirror, but a member with a mirror surface having a different shape (for example, a flat mirror) may be used instead. With the use of a confrontation mirror other than a spherical mirror as well, infrared rays that would otherwise stream outward from the opening O of the spheroidal mirror can be returned to the inside of the spheroidal mirror. Thus, energy loss can be suppressed compared to a case where no such confrontation mirror is provided. Besides, the confrontation mirror is, as the name indicates, a mirror facing the spheroidal mirror, which is provided so as to oppose the opening O and is capable of shielding radiation of infrared rays to the seed crystal side of the melting zone, thereby making it possible to cool the seed crystal side of the melting zone smoothly. To describe this example, the following expression may be adopted.

"A single crystal production apparatus that produces (production method designed to produce) a single crystal by cooling a melting zone formed by a heating part comprising an infrared generation part and a reflection part, wherein
the reflection part comprises
a spheroidal mirror and
a confrontation mirror disposed so as to oppose the spheroidal mirror, and
the confrontation mirror is disposed so as to cover at least part of an opening of the spheroidal mirror between the two focal points of the spheroidal mirror without obstructing a straight line connecting the two focal points".

Notwithstanding the above, if the confrontation mirror is a spherical mirror, one focal point F1 of the spheroidal mirror can be made to fall on the same location as the spherical center of the spherical mirror and thus irradiation efficiency with respect to the raw material M can be enhanced to a significant degree, so it is much more preferable to adopt a spherical mirror as in the above embodiment.

This confrontation mirror is disposed so as to cover at least part of the opening O of the spheroidal mirror 421a between the two focal points F1 and F0 of the spheroidal mirror 421a.

The expression "between the two focal points F1 and F0" means the following. The spheroidal mirror 421a has a shape obtained by cutting away a portion of an ellipsoid, and the following explanation assumes an imaginary form of this ellipsoid. In this imaginary ellipsoid, "between the two focal points F1 and F0" corresponds to a region interposed between two planes that are perpendicular to the straight line connecting the focal points F1 and F0 of the spheroidal mirror 421a (i.e., the ellipsoid) where one of the planes passes through the focal point F1 and the other passes through the focal point F0. The confrontation mirror is present in this region. In other words, the confrontation mirror is present in a region between the melting zone Ml and the focal point F1 in the imaginary ellipsoid. Note, however, that it is sufficient if at least a portion of the confrontation mirror is present in this region, and cases where a portion of the confrontation mirror is present in a location other than this region shall not be excluded.

"The confrontation mirror covers at least part of the opening O of the spheroidal mirror 421a" means that in a plan view of the opening O of the spheroidal mirror 421a in the vertical direction (hereinafter, referred to as "plan view", unless noted otherwise), at least part of the confrontation mirror appears to be covering the opening O. In other words, as far as it appears to be covering the same, the confrontation mirror may be disposed so as to be removed from the perimeter of the opening O of the spheroidal mirror 421a, or reversely as shown in FIG. 1, may be disposed slightly toward an inner side from the perimeter of the opening O of the spheroidal mirror 421a.

In addition, the confrontation mirror is disposed so as not to obstruct the straight line connecting the two focal points F1 and F0. The confrontation mirror is disposed so as not to cover the center of the circular opening O of the spheroidal mirror 421a. For example, as illustrated in FIG. 2, the confrontation mirror may cover a lower side of the circular opening O of the spheroidal mirror 421a (i.e., the side on which the melting zone on the seed crystal side is present) so as to cover 30%-95% of the area of the lower half of the opening O, including the lowermost end of the opening O. Setting the coverage to be higher than or equal to the aforementioned lower limit enables the infrared rays leaking from the spheroidal mirror 421a to be adequately returned toward the focal point F1 in the spheroidal mirror 421a while also enabling smoother cooling of the seed crystal side of the melting zone, and setting the coverage to be lower than or equal to the upper limit prevents excessive shielding of infrared rays, enabling adequate heating of the raw material M with infrared rays.

Defocusing by Spherical Mirror

It was mentioned earlier that the confrontation mirror is preferably a spherical mirror, because then it is possible to have one focal point F1 of the spheroidal mirror and the spherical center of the spherical mirror fall on the same location. Meanwhile, it is also useful to employ the construction of the aforementioned movable spherical mirror so that, during manufacture of a single crystal, the spherical center of the spherical mirror is intentionally displaced from the location at which the spherical center coincides with the one focal point F1 of the spheroidal mirror, and then infrared rays are reflected to the inside of the spheroidal mirror. Doing so does decrease the degree of light conversion, which however also means that the range over which infrared rays are radiated in the proximity of the focal point F2 will be increased. Accordingly, this constitution enables free adjustment of the degree to which the melting zone is cooled.

It should be noted that this defocusing can also be expected in cases where a confrontation mirror other than a spherical mirror is adopted (i.e., cases where there is no spherical center-focal point F1 match).

Use of Infrared Shielding Member Without Using Confrontation Mirror

The modifications above adopt a confrontation mirror, but an infrared shielding member (for example, a black metal member) may be adopted without employing a confrontation mirror. In this case, although infrared rays can no longer be returned to the spheroidal mirror as in the case employing a confrontation mirror, the seed crystal side of the melting zone Ml can be shielded, so the seed crystal side of the melting zone Ml can be cooled smoothly. To describe this example, the following expression may be adopted.

"A single crystal production apparatus that produces (or production method designed to produce) a single crystal by cooling a melting zone formed by heating a raw material through reflection of an infrared ray by a reflection part toward the raw material, the infrared ray being generated by an infrared generation part, wherein the reflection part comprises a spheroidal mirror and an infrared shielding member, and the infrared shielding member is disposed so as to cover at least part of an opening of the spheroidal mirror between the two focal points of the spheroidal mirror without obstructing a straight line connecting the two focal points."

Each of the above modifications may be applied to the above embodiment, or an appropriate combination of the modifications may be applied to the above embodiment. For example, the spherical mirror set forth in the modification "Application to Single Crystal Production Method (CVD) without Melting Zone Formation", or the spherical mirror set forth in the section "Reflection Part as Invention" may be replaced, as appropriate, with the infrared shielding member.

DESCRIPTION OF REFERENCE SYMBOLS

1: single crystal production apparatus
   11: quartz furnace tube
   12: lower shaft flange
   13: upper shaft flange
   14: atmosphere introduction port
   15: atmosphere discharge port
2: raw material grip portion
   21: raw material holder
   22: upper shaft
3: seed crystal grip portion
   31: seed crystal holder
   32: lower shaft
4: heating part
   41: infrared generation part
   42: reflection part
      421a, 422a: spheroidal mirror
         O: opening
      421b, 422b: (concave) spherical mirror
         H: hole
   51: shielding tube
   52: drive mechanism
M: raw material
   Ms: solid portion
   Ml: melting zone
   Mc: growth portion (single crystal)
S: seed crystal

The invention claimed is:

1. A single crystal production apparatus that produces a single crystal by cooling a melting zone formed by heating a raw material through reflection of an infrared ray, the single crystal production apparatus comprising:

a reflection part reflecting the infrared ray toward the raw material; and an infrared generation part generating the infrared ray, wherein the reflection part comprises a spheroidal mirror and a concave spherical mirror, wherein the infrared generation part is disposed at one focal point F1 of the spheroidal mirror, wherein an opening is formed in the spheroidal mirror on a side of an other focal point F0 of the spheroidal mirror, the other focal point F0 coinciding with a site where the melting zone is formed, wherein the concave spherical mirror is provided at a location at which the concave spherical mirror opposes the opening of the spheroidal mirror, wherein the one focal point F1 and a spherical center of the concave spherical mirror fall on a same location, wherein at least one from among a location of the concave spherical mirror relative to the opening of the spheroidal mirror and a range through which the concave spherical mirror covers die opening is variable, and wherein the concave spherical mirror is movable, such that the concave spherical mirror is accommodated in a location where the concave spherical mirror does not oppose the opening prior to in a case that the single crystal production apparatus is in use, and in the case that the single crystal production apparatus is in use, the concave spherical mirror is moved in a sliding, manner to a location where the concave spherical mirror opposes the opening.

2. The single crystal production apparatus according to claim 1, wherein the other focal point F0 of the spheroidal mirror is located further on a lower side in a vertical direction as viewed from the focal point F1 at which the infrared generation part is disposed.

3. The single crystal production apparatus according to claim 1, wherein the apparatus comprises a plurality of sets each constituted by the infrared generation part and the reflection part, and
wherein the other focal point F0 serves as a common focal point coinciding with the other focal point of the spheroidal mirror in each reflection part.

4. The single crystal production apparatus according to claim 1, further comprising a raw material grip portion and a seed crystal grip portion disposed on an upper side and a lower side, respectively, in a vertical direction.

5. The single crystal production apparatus according to claim 4, wherein the concave spherical mirror is disposed so as to oppose a lower side of the opening of the spheroidal mirror in the vertical direction.

6. The single crystal production apparatus according to claim 1, comprising a raw material grip portion and a seed crystal grip portion disposed on a lower side and an upper side, respectively, in a vertical direction.

7. The single crystal production apparatus according to claim 1, wherein the concave spherical mirror includes a constitution enabling displacement of the spherical center of the concave spherical mirror from a location at which the spherical center coincides with the one focal point F1 when reflecting an infrared ray to an inside of the spheroidal mirror.

8. The single crystal production apparatus according to claim 1, wherein the concave spherical mirror is constituted in a form of a shutter by connecting spherical mirror members, with long axes thereof extending in a horizontal direction, in a manner of a rosary and in a direction corresponding to short axes of the concave spherical mirror members.

9. The single crystal production apparatus according to claim 8, wherein the shutter is configured to be raised or lowered such that the range through which the concave spherical mirror covers the opening of the spheroidal mirror varies.

10. The single crystal production apparatus according to claim 1, wherein the range, through which the concave spherical mirror covers the opening, is variable.

11. The single crystal production apparatus according to claim 1, wherein the location of the concave spherical mirror, relative to the opening of the spheroidal mirror, is variable.

* * * * *